United States Patent
Kang et al.

[11] Patent Number: 5,869,842
[45] Date of Patent: *Feb. 9, 1999

[54] MUX AND DEMUX CIRCUITS USING PHOTO GATE TRANSISTOR

[75] Inventors: Sung-Weon Kang; Jin-Ho Lee, both of Daejeon, Rep. of Korea

[73] Assignee: Electronics and Telecommunications Research Research Institute, Daejeon, Rep. of Korea

[*] Notice: The term of this patent shall not extend beyond the expiration date of Pat. No. 5,389,196.

[21] Appl. No.: 718,247

[22] Filed: Sep. 20, 1996

[30] Foreign Application Priority Data

Dec. 20, 1995 [KR] Rep. of Korea ................... 1995-52665

[51] Int. Cl.$^6$ .................................................. H01L 29/00
[52] U.S. Cl. .................................. 250/551; 250/214 VT; 327/414; 327/418; 313/306; 313/309
[58] Field of Search ................................... 250/551, 229, 250/214.1, 214 R, 214 DC, 214 L, 214 SW, 214 VT; 257/10, 11, 9, 618, 622, 773; 327/407, 408, 411, 414, 415, 416, 417, 418; 313/306, 307, 309, 310, 346 R, 373, 383

[56] References Cited

U.S. PATENT DOCUMENTS

| | | | |
|---|---|---|---|
| 4,010,385 | 3/1977 | Krol | 327/408 |
| 4,095,133 | 6/1978 | Hoeberechts . | |
| 4,490,626 | 12/1984 | Carlson | 327/408 |
| 5,212,426 | 5/1993 | Kane . | |
| 5,389,796 | 2/1995 | Kang et al. . | |

FOREIGN PATENT DOCUMENTS

| | | |
|---|---|---|
| 0354750 | 2/1990 | European Pat. Off. . |
| 0495414 | 7/1992 | European Pat. Off. . |
| 9110252 | 7/1991 | WIPO . |

*Primary Examiner*—Edward P. Westin
*Assistant Examiner*—John R. Lee
*Attorney, Agent, or Firm*—Antonelli, Terry, Stout & Kraus, LLP

[57] ABSTRACT

MUX and DEMUX circuits using a photo gate transistor having a pair of thin film electrodes respectively serving as emission and collector electrodes. When photons with at least critical energy are irradiated onto the emission electrode, electrons are emitted from the emission electrode, so that the associated photo gate transistor can carry out a gating operation. The MUX circuit divides a plurality of electrical signals in a time division manner so that the transmission of those signals can be carried out through a single transmission line. The DEMUX circuit recovers an original signal from signals transmitted in a time division manner via a single transmission line. Input signals are received to emission electrodes while being limited in voltage level by input resistor pairs. An optical source irradiates photons to an emission electrode in sync with the application of an input signal. By the irradiation of photons, the emission electrode emits electrons which are transmitted to a collector electrode. As a result, output voltage is output. The output voltage corresponds to the quantity of current of the transmitted signal which is determined by an output resistor in accordance with voltage from a voltage source and the intensity of the irradiated photons.

4 Claims, 5 Drawing Sheets

MUX AND DEMUX CIRCUITS USING PHOTO GATE TRANSISTOR

BACKGROUND OF THE INVENTION

1. Field of the Invention

The present invention relates to MUX and DEMUX circuits using a photo gate transistor utilizing a field emission process adapted to emit electrons by applying an electric field between two adjacent electrodes in a vacuum or gas, such as the atmosphere, and a photoelectric effect adapted to emit electrons by irradiating photons with at least critical energy onto the surface of a particular material layer.

2. Description of the Prior Art

The recent development of electronic devices capable of achieving a high-speed operation, high integration and high reliability is based on the development of the physics relating to solid semiconductors. Such a demand on high-speed operation, high integration and high reliability is continuously increasing.

However, the development of such electronic devices has reached the limit of ultra-microprocessing techniques. As a result, various problematic factors are exhibited.

In particular, the conduction phenomenon of electrons occurring in a solid electronic device is determined by a scattering phenomenon of electrons resulting from electrons striking against grains in the solid electronic device. Accordingly, the mobility of electrons which is indicative of the degree of the conduction phenomenon is a very important physical quantity.

For this reason, electron mobility became the factor for determining electrical characteristics of semiconductor devices and materials of those semiconductor devices.

In the case of transistors using a silicon substrate, the mobility of electrons and holes in the silicon substrate is fixedly determined. As a result, the performance of such transistors is fixedly determined.

FIG. 1 is a sectional view illustrating a typical MOSFET as a conventional solid electronic device. This MOSFET includes a gate electrode 1, a source 2, a drain 3, a gate insulating film 4 and a silicon substrate 5.

In accordance with the operation principle of the MOSFET shown in FIG. 1, the greater part of the silicon substrate 5 serves only as a support. Actually, the movement of electrons is carried out in a channel induced in a portion of the silicon substrate disposed beneath a gate insulating film.

Also, the operation speed of the MOSFET is determined by the mobility of electrons in the silicon substrate 5.

As a result, MUX/DEMUX circuits using such a solid electronic device have a problem in that the limit of the high-speed operation is determined by the characteristic of the solid electronic device.

SUMMARY OF THE INVENTION

Therefore, an object of the invention is to solve the above-mentioned problems and to provide MUX and DEMUX circuits using a photo gate transistor in which electrons move in a vacuum or gas such as the atmosphere, instead of a solid semiconductor channel, so that the movement of electrons can be carried out without any scattering phenomenon resulting from their striking against molecules, atoms or other grains while being determined only by electric field from the outside applied between two adjacent electrodes, thereby achieving an increase in electron mobility which provides a high-speed operation characteristic.

In accordance with one aspect, the present invention provides an MUX circuit comprising: a plurality of emission electrodes for receiving a plurality of input signals via input resistors, respectively, each of the emission electrodes operating by photons irradiated thereon, thereby emitting electrons based on the input signal received therein; a plurality of optical sources for generating photons and irradiating them to the emission electrodes in sync with the input signals controlling the emission of electrons from the emission electrodes, respectively; and a collector electrode for receiving electrons from each of the emission electrodes and outputting an electrical output signal based on the received electrons via an output resistor, the electrical output signal being in a full-up state by a voltage source, whereby the input signals are transmitted to a single output stage in a time-division manner.

In accordance with another aspect, the present invention provides an MUX circuit comprising: a plurality of optical sources for generating photons under control of a plurality of input signals, respectively; a plurality of switches for performing their switching operations in sync with the input signals, respectively; a plurality of emission electrodes for receiving photons from the optical sources and emitting electrons under control of the switches, respectively; a collector electrode for collecting electrons from each of the emission electrodes and outputting an electrical output signal based on the received electrons via an output resistor, the electrical output signal being in a full-up state by a voltage source, whereby the input signals are transmitted to a single output stage in a time-division manner.

In accordance with another aspect, the present invention provides an DEMUX circuit comprising: a plurality of emission electrodes for receiving an input signal from a single input stage via input resistors, respectively, each of the emission electrodes operating by photons irradiated thereon, thereby emitting electrons based on the input signal received therein; a plurality of optical sources for generating photons and irradiating them to the emission electrodes in sync with the input signal controlling the emission of electrons from the emission electrodes, respectively; and a plurality of collector electrodes respectively corresponding to the emission electrodes for collecting electrons from the corresponding emission electrodes and outputting electrical output signals based on the received electrons via output resistors, respectively, each of the electrical output signals being in a full-up state by a voltage source, whereby the input signal from the single input stage is transmitted to a plurality of output stages.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The present invention realizes a circuit operating at a high speed by using a photo gate transistor having a pair of thin film electrodes respectively serving as emission and collector electrodes. When photons with at least critical energy are irradiated onto the emission electrode, electrons are emitted from the emission electrode, so that the associated photo gate transistor can carry out a gating operation. For example, an MUX circuit can be realized, which divides a plurality of electrical signals in a time division manner so that the transmission of the electrical signals can be carried out through a single transmission line. A DEMUX transistor can also be realized, which recovers an original signal from signals transmitted in a time division manner via a single transmission line.

Figure 1:
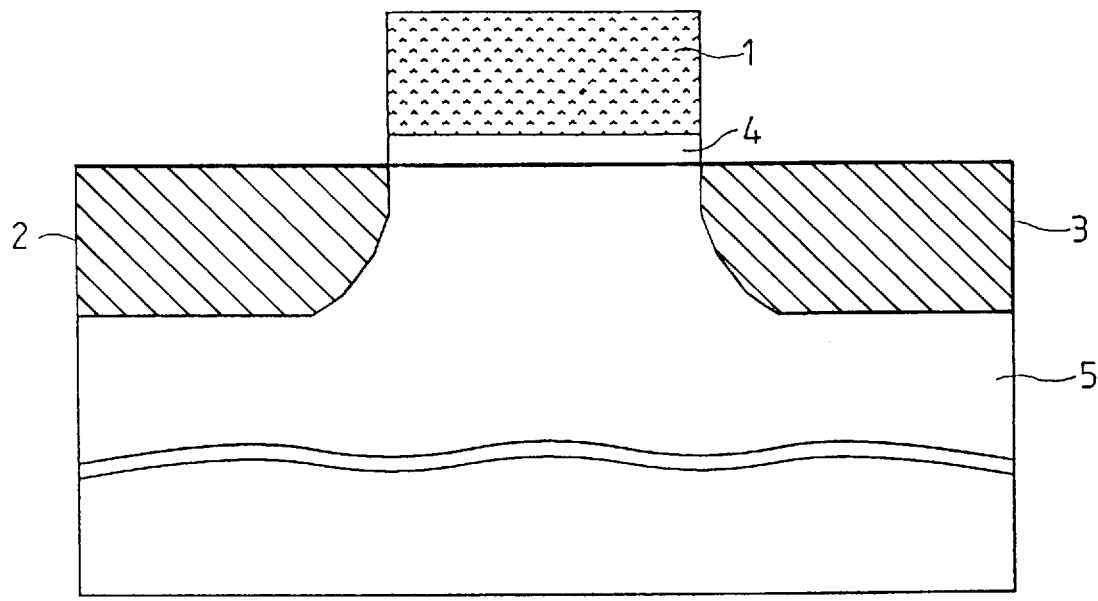
FIG. 1 is a sectional view illustrating a typical MOSFET as a conventional solid electronic device.
Figure 2:
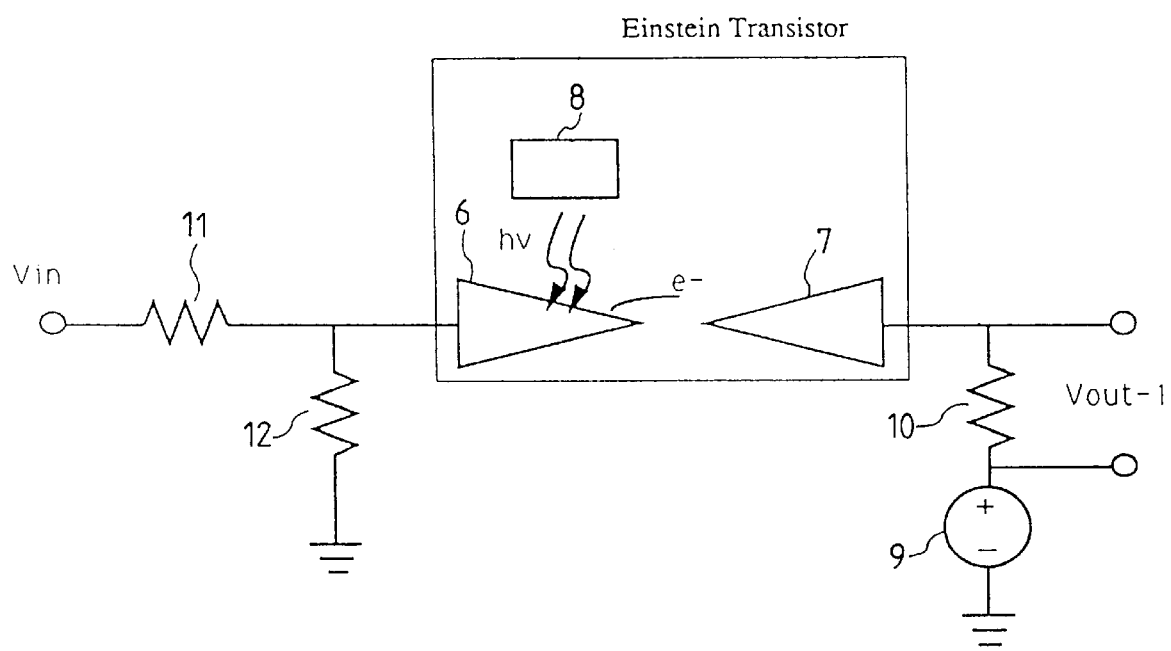
FIG. 2 is a circuit diagram illustrating the basic circuit of a photo gate transistor used in accordance with the present invention.

FIG. 2 is a circuit diagram illustrating a photo gate transistor, used in accordance with the present invention, which is a basic circuit for driving the photo gate transistor. In accordance with the present invention, the principle of "the photoelectric effect" issued by Einstein is utilized as a method for exciting electrons emitted from the source 2 in the structure shown in FIG. 1 In order to induce the electrons emitted from the source 2 to the drain 3.

The photo gate transistor includes an emission electrode 6 serving as the source of a MOS transistor in a gas atmosphere in a vacuum or atmospheric pressure, a collector electrode 7 adapted to collect electrons emitted from the emission electrode 6, and an optical source 8 adapted to irradiate light onto the surface of the emission electrode 6.

Either the emission electrode 6 or collector electrode 7 has a needle tip shape in order to concentrate an electric field on the tip of the electrode, thereby enabling an easily induced emission of electrons. These electrodes may have various shapes.

In accordance with the above-mentioned construction, electrons emitted from the emission electrode 6 can move to the collector electrode 7 without striking against molecules, atoms or other grains. Accordingly, the photo gate transistor of the present invention can achieve a high-speed operation as compared to conventional solid electronic devices.

On the other hand, where the quantity of current generated by emitted electrons is to be controlled, the control may be achieved by increasing or decreasing the level of voltage supplied from the voltage source 9 or controlling the intensity of light emitted from the optical source 8.

The current controlled as mentioned above can be indicated in the form of output voltage by an output resistor 10. In order to divide an input signal into signals with appropriate voltage levels, a pair of input resistors 11 and 12 connected in series are also provided. One of the input resistors, namely, input resistor 11 is coupled to an input stage Vin whereas the other input resistor, namely, input resistor 12 is coupled to the ground.

Figure 3:
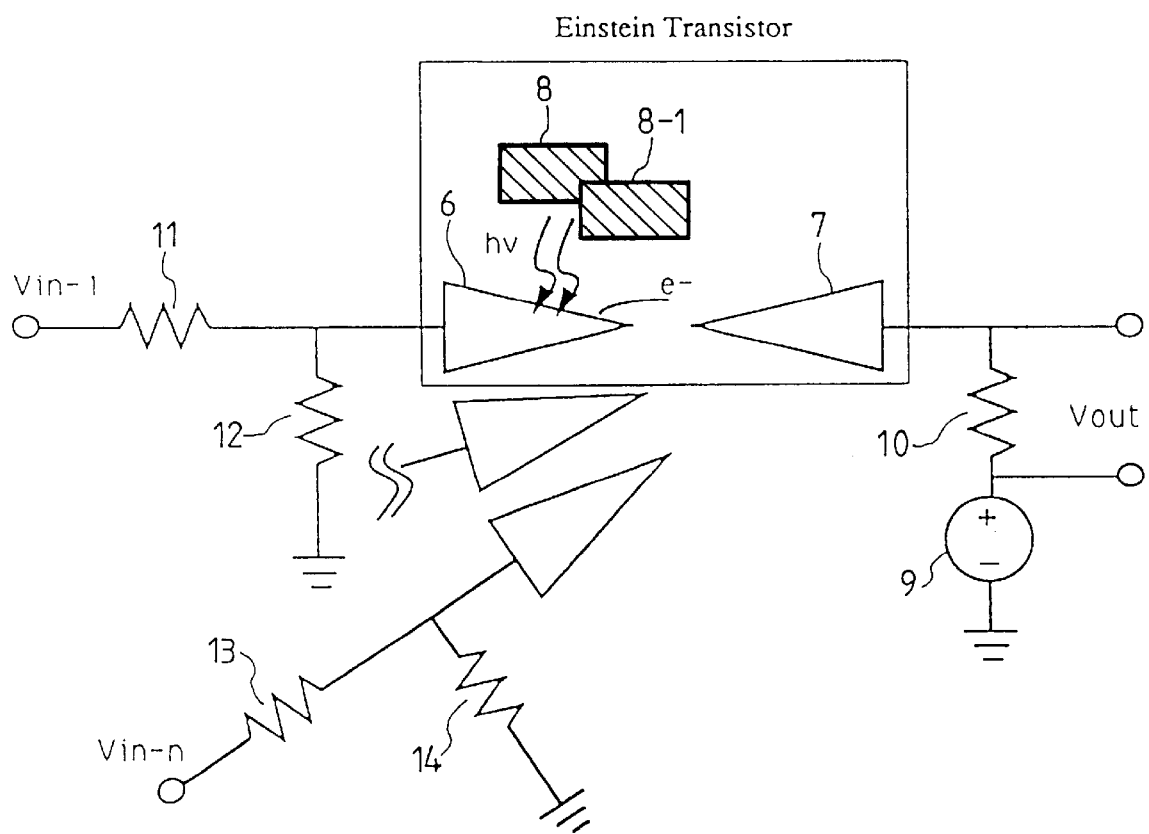
FIG. 3 is a circuit diagram of a MUX circuit according to an embodiment of the present invention.

FIG. 3 is a circuit diagram of an MUX circuit which uses the photo gate transistor according to an embodiment of the present invention to have n channels. In FIG. 3, elements respectively corresponding to those in FIG. 2 are denoted by the same reference numerals.

As shown in FIG. 3, a plurality of input signals Vin-1 to Vin-n are coupled to emission electrodes 6 via resistor pairs corresponding to the input signals, respectively. Each input signal is limited in voltage level in a desired ratio by associated resistor pairs. In FIG. 3, only two pairs of resistors 11, 12 and 13, 14 are shown.

In this case, the MUX circuit also includes a plurality of optical sources respectively corresponding to input signals Vin-1 to Vin-n. In FIG. 3, only two optical sources 8 and 8-1 are shown. The MUX circuit further includes a single collector electrode 7. Between the collector electrode 7 and the output stage of the MUX circuit, a voltage source 9 is coupled via an output resistor 10.

When an input signal is applied to the MUX circuit, the optical source associated with the applied input signal irradiates photons to the associated emission electrode 6 in sync with the application of the input signal. By the irradiation of photons, the emission electrode 6 emits electrons which are, in turn, transmitted to the collector electrode 7.

As a result, output voltage Vout is output. The output voltage Vout corresponds to the quantity of current of the transmitted signal which is determined by the output resistor 10 in accordance with voltage from the voltage source 9 and the intensity of the irradiated photons.

In this case, only one of the input signals Vin-1 to Vin-n can be selected by selecting one particular optical source. The operating time of the selected optical source is determined by a synchronous frequency used for the optical source selection.

This MUX circuit has no capacitance component between its gate and emission electrodes in accordance with the characteristic of the photo gate transistor. As a result, the MUX circuit can operate in an ultra-high frequency band of the photo gate transistor at a speed capable of modulating the intensity of photons from the optical sources. Accordingly, the MUX circuit can realize high-speed multiplexing.

Figure 4:
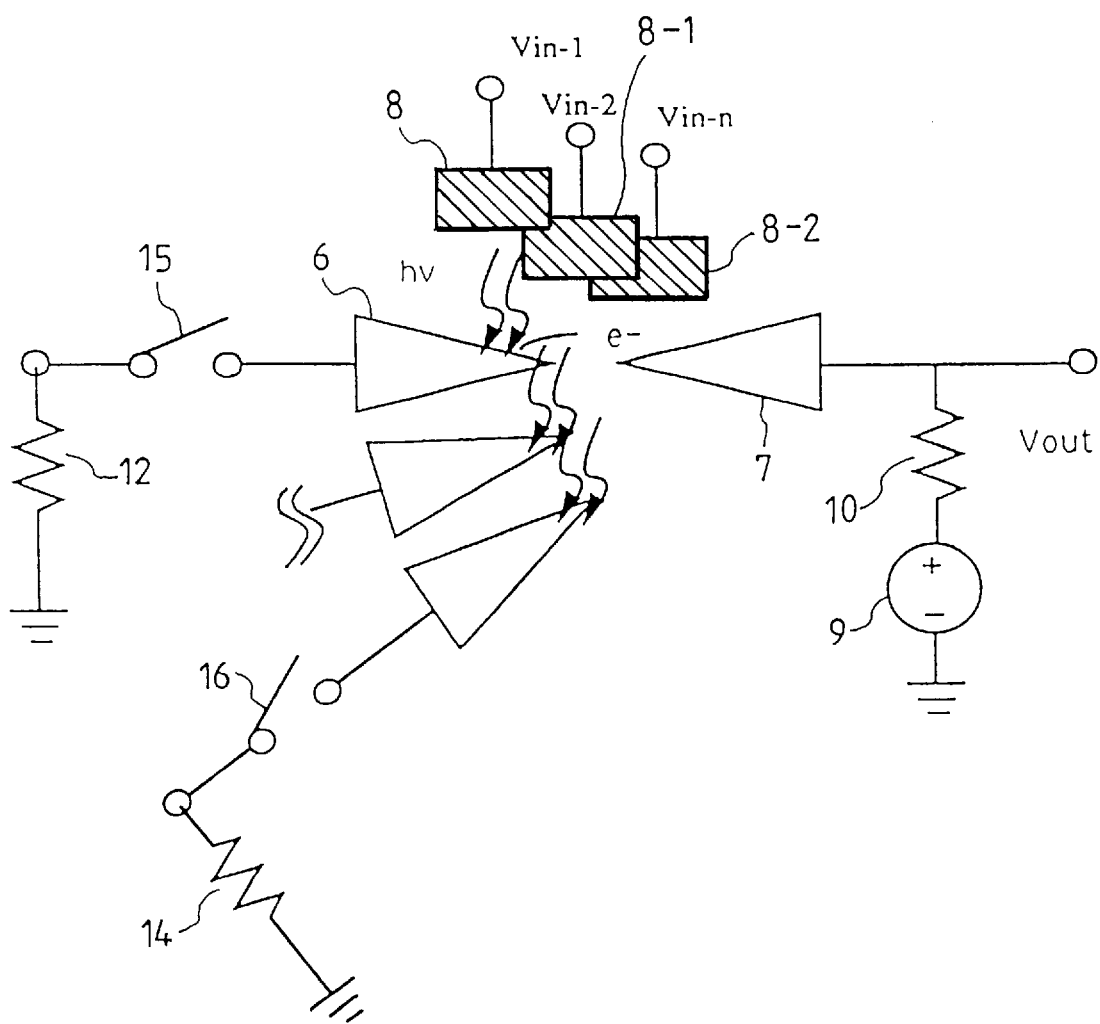
FIG. 4 is a circuit diagram of a MUX circuit according to another embodiment of the present invention.

FIG. 4 is a circuit diagram of an MUX circuit which uses a photo gate transistor according to another embodiment of the present invention, wherein input signals Vin-1 to Vin-n directly activate light sources, respectively, to drive the photo gate transistor, as differently from the MUX circuit of FIG. 3, wherein one of those input signals is selected and transmitted by emitting photons from one of emission electrodes associated with the selected input signal in accordance with a gate operation of the associated light source. In FIG. 4, elements respectively corresponding to those in FIG. 3 are denoted by the same reference numerals.

As shown in FIG. 4, the MUX circuit includes a plurality of switches respectively connected to emission electrodes. The switches operate in sync with different input signals, respectively. In FIG. 4, only two switches 15 and 16 are shown. A resistor is coupled to each switch to control the quantity of current based on electrons from the associated emission electrode 6, thereby preventing overcurrent from flowing in an associated photo gate.

When one of the switches is selected in accordance with an input signal, a light source 8 associated with the selected switch irradiates photons in accordance with the input signal. As a result, the emission electrode 6 associated with the light source 8 irradiating photons emits electrons which are, in turn, transmitted to a single collector electrode 7.

The current resulting from the electrons is exhibited in the form of output voltage Vout by an output resistor 10.

Thus, a desired one of input signals can be selected using the switches so that it can be transmitted.

Figure 5:
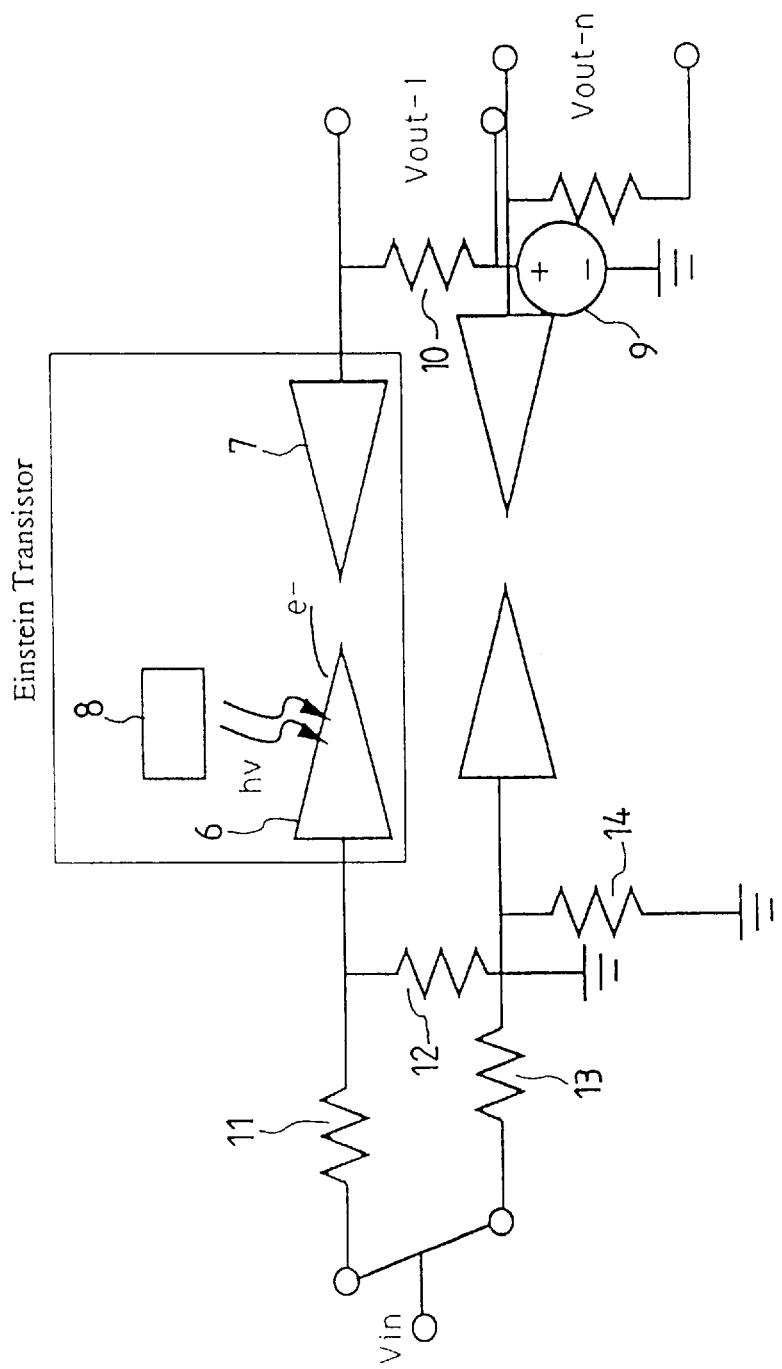
FIG. 5 is a circuit diagram of a DEMUX circuit according to another embodiment of the present invention.

On the other hand, FIG. 5 is a circuit diagram illustrating a DEMUX circuit using a photo gate transistor in accordance with another embodiment of the present invention. In FIG. 5, elements respectively corresponding to those in FIG. 3 are denoted by the same reference numerals.

In this case, the DEMUX circuit includes a plurality of emission electrodes coupled to an input signal Vin via resistor pairs. The input signal is divided in voltage level in an appropriate ratio by each pair of resistors. In FIG. 5, only two pairs of resistors 11, 12 and 13, 14 are shown. The input signal is then applied to emission electrodes 6 respectively corresponding to the resistor pairs.

The DEMUX circuit also includes a plurality of optical sources 8 which operate in sync with different input signals, respectively. The optical sources 8 are associated with the emission electrodes 6, respectively. The DEMUX circuit further includes a plurality of collector electrodes 7 respectively associated with the emission electrodes 6. When one of the optical sources operates in sync with the application of the input signal, it emits photons which are irradiated to an associated one of the emission electrodes 6. As a result, the emission electrode 6 receiving the photons emits electrons which are, in turn, transmitted to an associated one of the collector electrodes 7 by a voltage source 9.

The quantity of current based on electrons emitted from the emission electrode 6 is exhibited in the form of output voltage Vout by an output electrode 10. In this case, the quantity of current can be controlled in accordance with voltage from the voltage source 9 and the intensity of photons emitted from the optical source 8.

Accordingly, it is possible to achieve demultiplexing for transmitting time-divided information to a desired one of output stages Vout-1 to Vout-n by driving a desired one of optical sources 8 for an optional time in accordance with the input signal Vin.

As apparent from the above description, the present invention can realize a variety of high-speed circuits by using the high-speed operation characteristic of the optical gate transistor. In the case of MUX/DEMUX circuits constructed in accordance with the present invention, optical signals to be transmitted can be converted into electrical signals. The present invention also provides an advantage in that the MUX/DEMUX circuits can be driven while controlling output voltage in accordance with voltage from the voltage source and the intensity of photons emitted from the optical source. Thus, it is possible to simply realize drive circuits.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An MUX circuit, comprising:

a plurality of emission electrodes for receiving a plurality of input signals via input resistors, respectively, each of said emission electrodes operating by having photons irradiated thereon, thereby emitting electrons based on the input signal received therein;

a plurality of optical sources for generating photons and irradiating said photons to said emission electrodes in sync with said input signals controlling the emission of electrons from said emission electrodes, respectively; and a collector electrode for receiving electrons from each of said emission electrodes and outputting an electrical output signal based on the received electrons via an output resistor, the electrical output signal being in a full-up state by a voltage source, wherein the input signals are transmitted to a single output stage in a time-division manner.

2. An MUX circuit, comprising:

a plurality of optical sources for generating photons under control of a plurality of input signals, respectively;

a plurality of switches for performing switching operations in sync with said input signals, respectively;

a plurality of emission electrodes for receiving photons from said optical sources and emitting electrons under control of said switches, respectively;

a collector electrode for collecting electrons from each of said emission electrodes and outputting an electrical output signal based on the received electrons via an output resistor, the electrical output signal being in a full-up state by a voltage source, wherein said input signals are transmitted to a single output stage in a time-division manner.

3. The MUX circuit in accordance with claim 2, further comprising a plurality of resistors, each coupled to an input terminal of each of said emission electrodes and the ground and adapted to control an amount of current from the emission electrode, thereby preventing overcurrent from flowing in an optical gate.

4. A DEMUX circuit, comprising:

a plurality of emission electrodes for receiving an input signal from a single input stage via input resistors, respectively, each of said emission electrodes operating by having photons irradiated therein, thereby emitting electrons based on the input signal received therein;

a plurality of optical sources for generating photons and irradiating said photons to said emission electrodes in sync with the input signal controlling the emission of electrons from said emission electrodes, respectively; and a plurality of collector electrodes respectively corresponding to said emission electrodes and collecting electrons from the corresponding emission electrodes and outputting electrical output signals based on the received electrons via output resistors, respectively, each of the electrical output signals being in a full-up state by a voltage source, whereby the input signal from the single input stage is transmitted to a plurality of output stages.

* * * * *